United States Patent [19]
Kling

[11] Patent Number: 5,701,665
[45] Date of Patent: Dec. 30, 1997

[54] PI SIGNAL FREQUENCY FILTER METHOD OF MANUFACTURE

[75] Inventor: John Phillip Kling, Mt. Joy, Pa.

[73] Assignee: The Whitaker Corporation, Wilmington, Del.

[21] Appl. No.: 5,701

[22] Filed: Jan. 19, 1993

[51] Int. Cl.$^6$ ................ H03H 3/00; H03H 7/01
[52] U.S. Cl. ............... 29/825; 333/182; 333/184
[58] Field of Search ................ 333/182, 183, 333/185, 184; 439/607, 608, 620; 29/592.1, 825; 427/79

[56] References Cited

U.S. PATENT DOCUMENTS

| | | | |
|---|---|---|---|
| Re. 29,258 | 6/1977 | Fritz | 333/182 |
| 3,275,953 | 9/1966 | Coda et al. | 333/182 |
| 3,538,464 | 11/1970 | Walsh | 333/182 |
| 3,588,758 | 6/1971 | Hurst | 333/183 |
| 3,597,711 | 8/1971 | Buckley | 333/183 |
| 3,638,147 | 1/1972 | Denes | 333/182 |
| 3,764,943 | 10/1973 | Fort | 333/182 |
| 3,840,841 | 10/1974 | Clark | 333/182 X |
| 4,083,022 | 4/1978 | Nijman | 333/183 |
| 4,458,220 | 7/1984 | Carter et al. | 333/182 |
| 4,647,122 | 3/1987 | Kelly | 439/608 X |
| 4,700,156 | 10/1987 | Blamine et al. | 333/182 |
| 4,729,743 | 3/1988 | Farrar et al. | 439/276 |
| 4,734,663 | 3/1988 | Focht | 333/182 |
| 4,853,659 | 8/1989 | Kling | 333/184 |

FOREIGN PATENT DOCUMENTS

| | | |
|---|---|---|
| 0 025 367 | 3/1981 | European Pat. Off. |
| 4008507A1 | 3/1989 | Germany |

OTHER PUBLICATIONS

European Search Report.

*Primary Examiner*—Benny Lee

[57] ABSTRACT

A method of manufacturing a pi filter (24) includes a ferrite sleeve (26) providing an inductance coating the sleeve with a dielectric material (36) and plating (28–34, 38) to define spaced capacitive regions (R) on the sleeve with a signal conductor (18) soldered (S) to the inside plating (28) of the sleeve and a ground circuit (22) soldered (S') to the outside of the sleeve with the platings serving as electrodes for capacitances C of the filter. Multiple filters (24) are taught in use in an electrical connector (10).

2 Claims, 4 Drawing Sheets

PI SIGNAL FREQUENCY FILTER METHOD OF MANUFACTURE

FIELD OF THE INVENTION

This invention relates to a one-piece pi filter for filtering out unwanted frequencies from electronic signals.

BACKGROUND OF THE INVENTION

The widespread use of sensitive electronic devices has led to a need for filtering out unwanted frequency components from signals that can cause damage to such devices or a loss of information carried by such signals. A wide variety of filter devices are employed, depending upon the particular frequency range of signals and unwanted components. One such filter termed a pi filter typically consists of at least four discrete components, a capacitor body, at least one ferrite bead, and end caps with the ferrite providing an inductance in series with a signal line, and the capacitive body connected between electrodes through the end caps with further electrodes connected to ground. Additionally, these elements are frequently stacked on a contact pin and assembled as by soldering.

The present invention has as an object the provision of a pi filter made in a single piece, with the various inductive and capacitive constituents integrated together. A further object is to provide a novel, one-piece pi filter having excellent isolation characteristics for signals in the megahertz range. A still further object is to provide a novel, one-piece pi filter and method of manufacture that is simpler to handle and to employ in electrical connectors.

SUMMARY OF THE INVENTION

The present invention achieves the foregoing objects through the provision of a ferrite body having an appropriate inductance L in the form of a bead or sleeve utilized as a core having a bore extending therethrough. The body is plated through the bore and around the ends with the center portion of the body, externally, left unplated through the use of resists or the like. Thereafter, a thick film type of dielectric material, such as barium titanate or strontium titanate, is applied over the entire outside surface of the body, and a ground electrode is formed as by plating over the dielectric layer with a separation between the ends of the body, the plating thereof. The dielectric material is suitably hardened as by sintering during the process, and the resulting structure has a pair of separate electrodes beneath the dielectric material with a single electrode band overlapping such bands to define distinct capacitive regions between the plating of the body and the plating over the dielectric material. These capacitive regions combine with the inductance of the body to provide a pi filter all in one piece. In accordance with the method of the invention, the body is formed of a ferrite sleeve that is suitably plated utilizing a resist to define the center space band, with a coating of dielectric material, and with additional resist bands employed to define the further electrodes as by electroplating. Pi filter bodies in the form of sleeves are then placed on the signal conductors of a connector and soldered thereto at the ends. A ground structure, such as a shielding ground of a connector is soldered to the outside center electrode of the filter. In this way, multiple pin connectors can be made to have pi filters that are easily applied, compact, and simple to use. Such filters are, by the nature of construction, more rugged than multi-part pi filters and take up less space than traditional non-integrated filters.

DETAILED DESCRIPTION OF THE INVENTION

Figure 6:
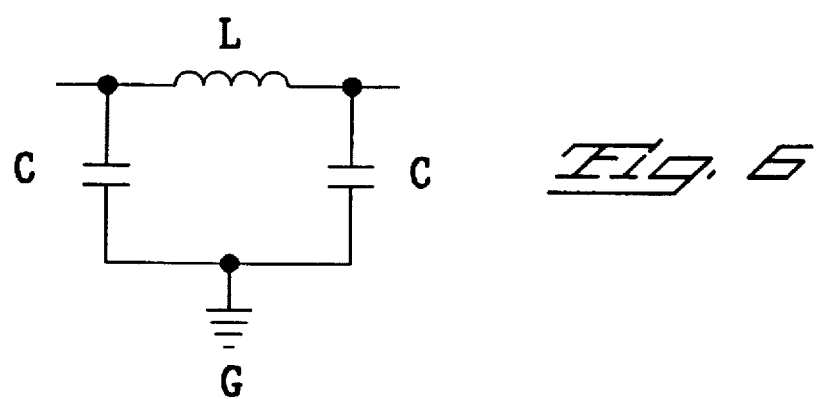
FIG. 6 is a schematic diagram of a pi filter.

Referring first to FIG. 6, a pi-type filter is represented, including an inductance L and two capacitors C, the inductance being connected in the line transferring a signal, and the capacitors being connected at each end of the inductance to ground. Typically this is accomplished through an interconnection of the electrodes of capacitors attached to a capacitor body with ferrite beads in essence fitted over a conductive pin with the pin interconnected to carry the signal sought to be filtered. Pi filters are widely used to achieve a filtering of the unwanted frequencies in the megahertz range.

Figure 1:
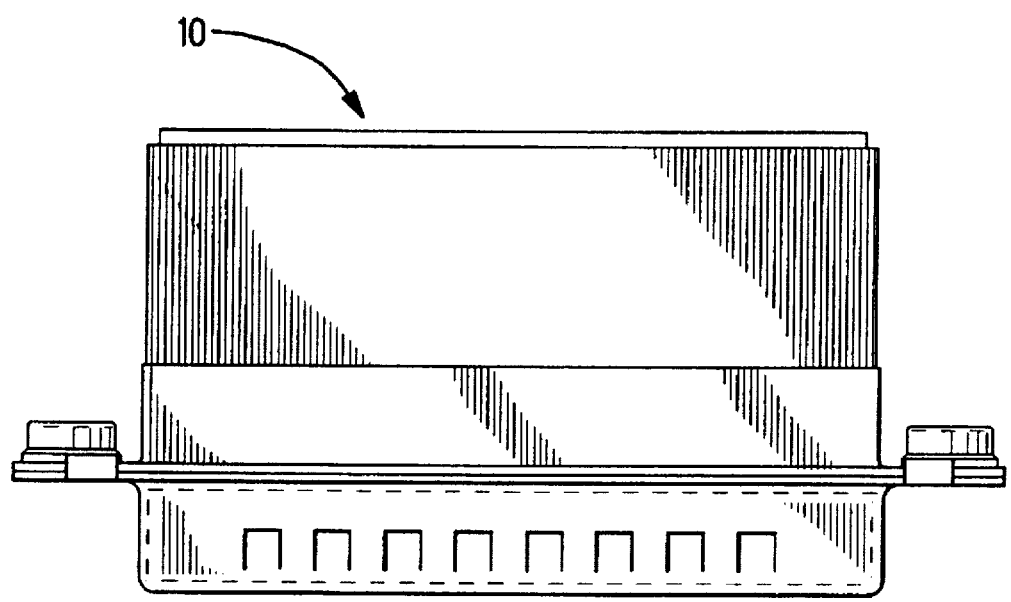
FIG. 1 is a plan view from the top of a multi-pin electrical connector.
Figure 2:
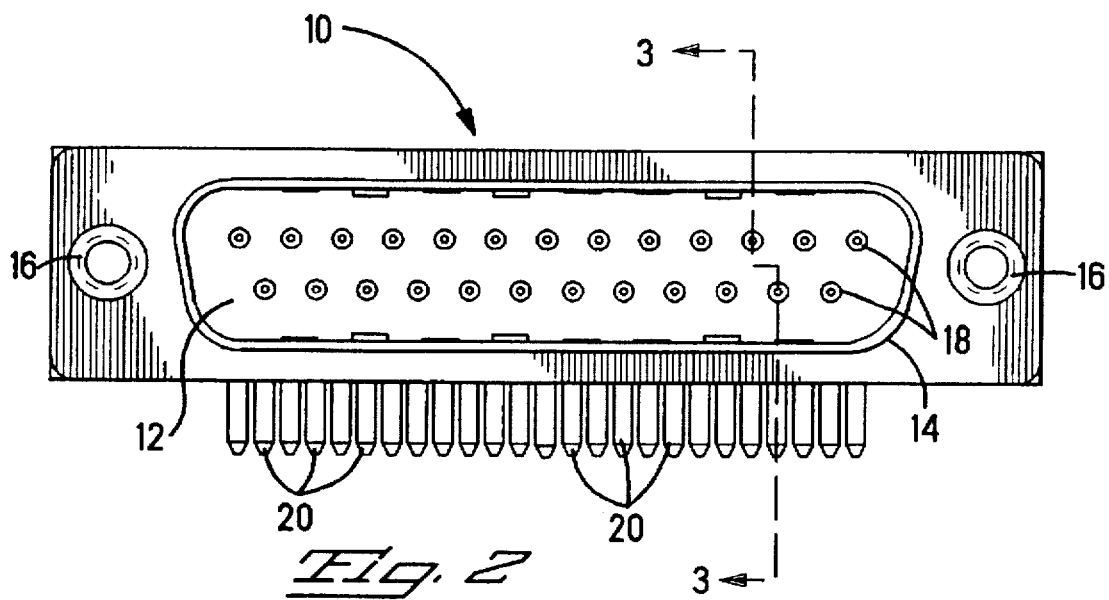
FIG. 2 is an elevation view taken from the front of the connector shown in FIG. 1.
Figure 3:
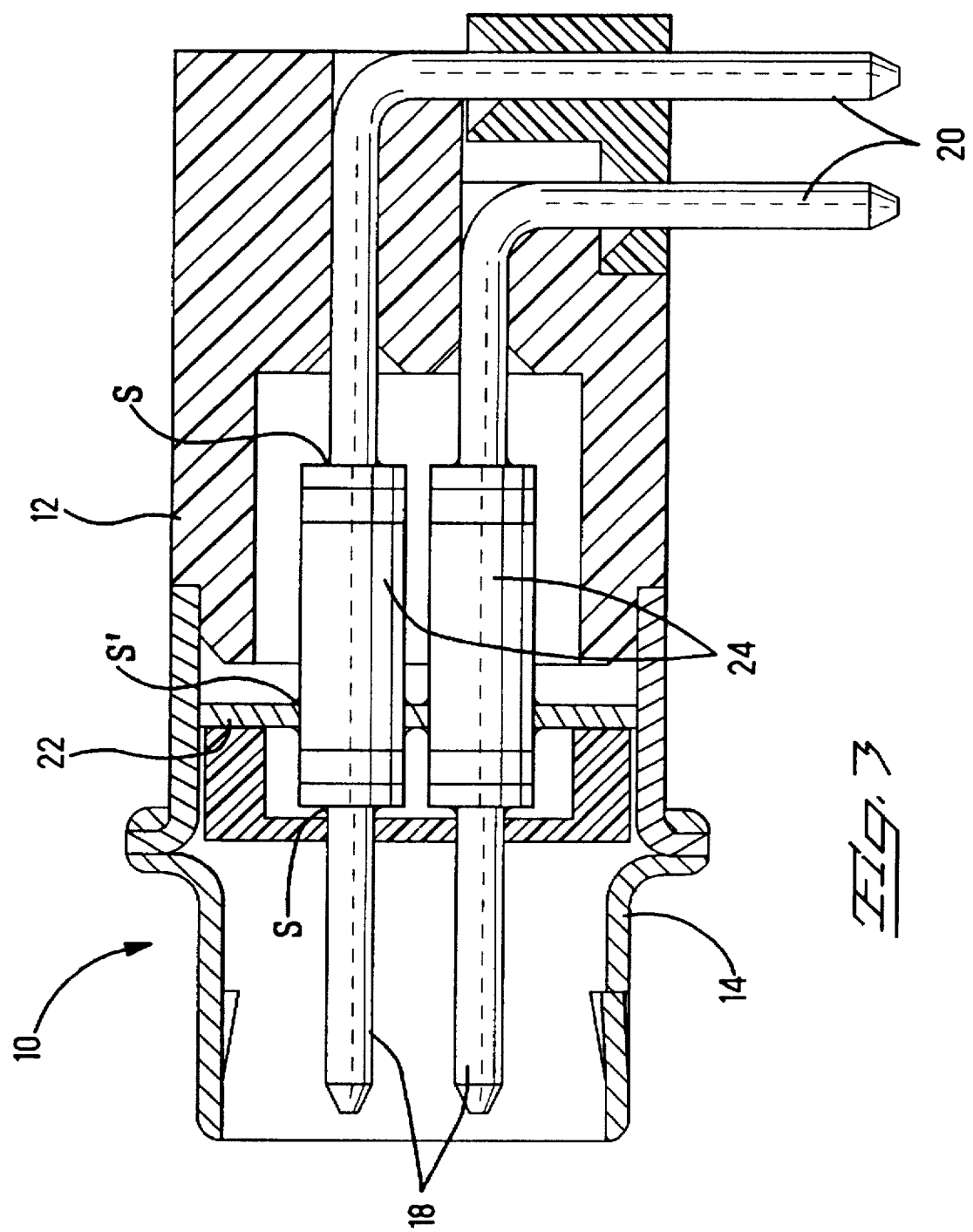
FIG. 3 is a side, elevational, and partially sectioned view taken through lines 3—3 of FIG. 1.
Figure 4:
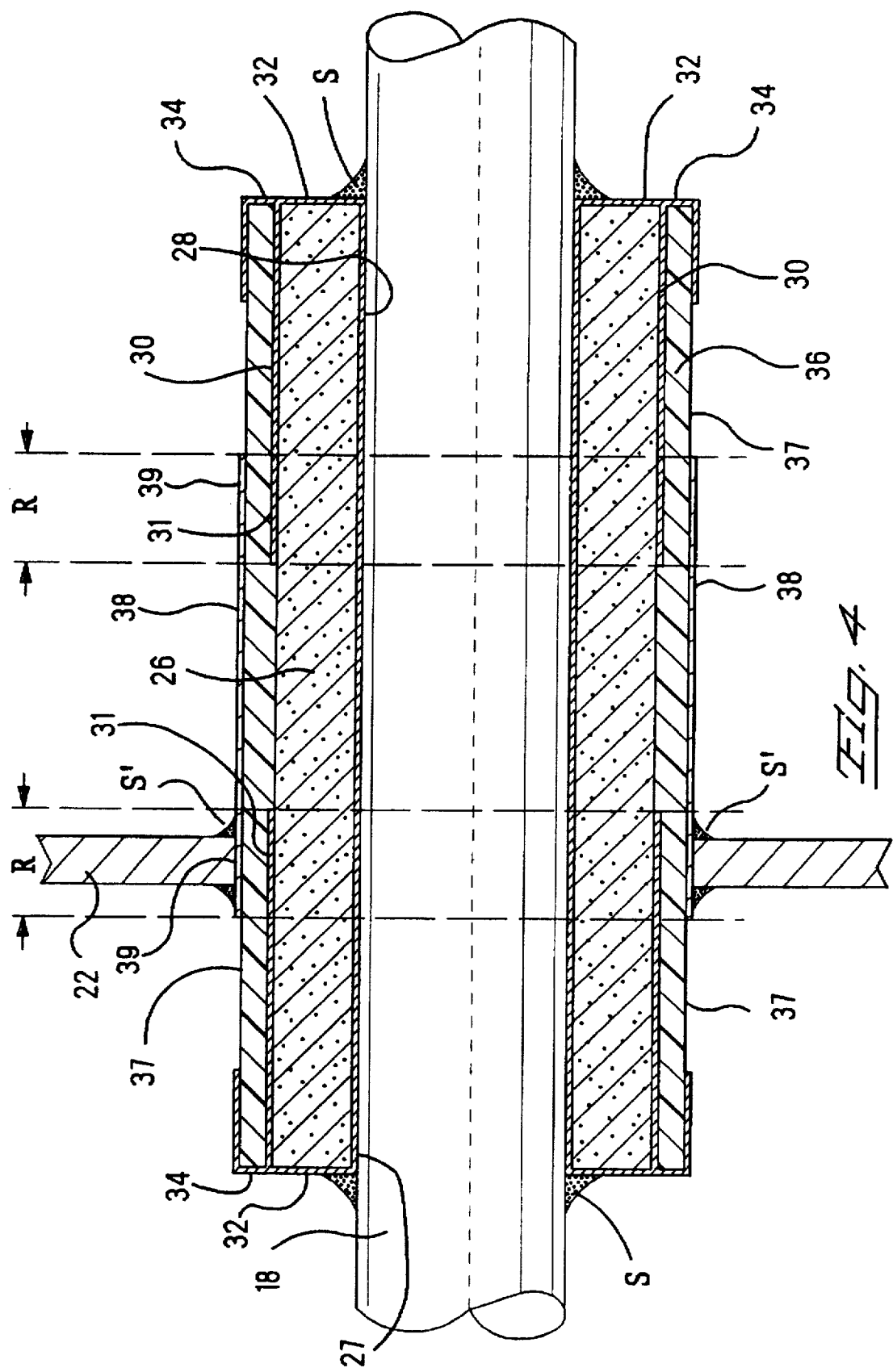
FIG. 4 is a side, sectional view of the filter of the invention as applied to the signal and grounding paths of a connector.
Figure 5:
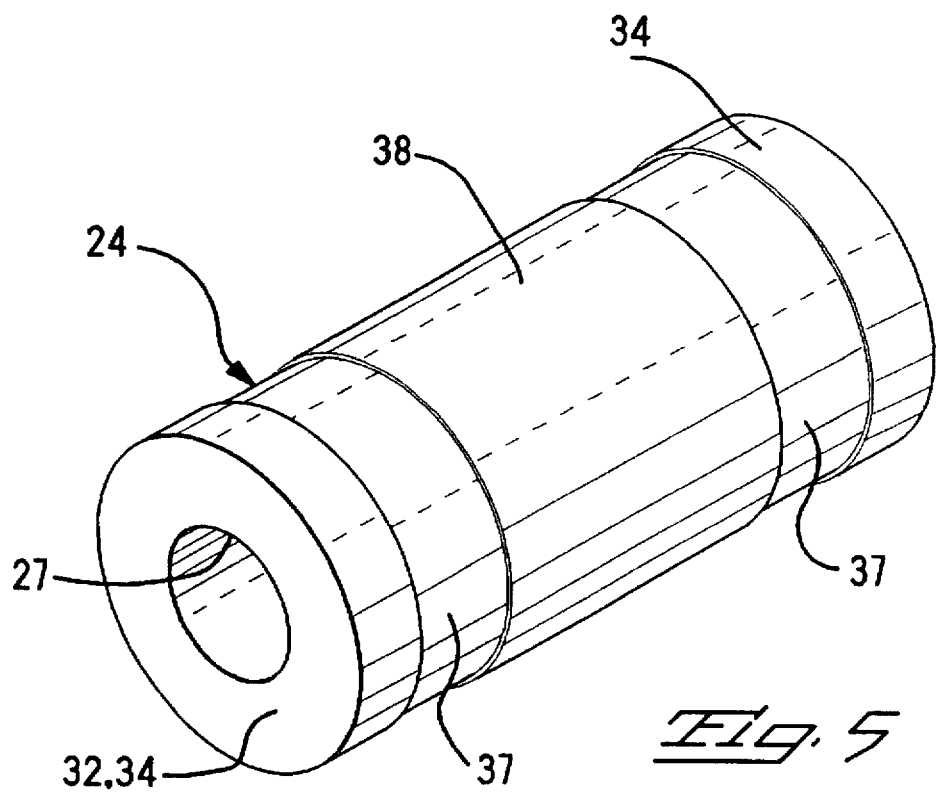
FIG. 5 is a perspective of the filter of the invention prior to application to a connector.

FIG. 1 shows a typical electrical connector 10 having multiple contact pins that serve to interconnect with a mating connector half connected to the wires of cables and to a printed circuit board. FIGS. 1 to 3 show the connector 10 to include a plastic and dielectric body housing 12, a grounding shield 14 that extends over the front portion of the connector and surrounds two rows of contacts 18 that extend forwardly for intermating with a further connector. The contacts 18 terminate as at 20 in posts that are soldered to the circuits of a printed circuit board. The connector 10 is typically mounted on a panel through fasteners 16 on each side of body 12. In accordance with the invention and as shown in FIG. 3, the signal conductors 18 each include a filter body 24 fitted over the contact pins and soldered thereto as at S with an outside electrode of the filter soldered to ground shield 22. FIG. 5 shows the filter body 24 in the form of a sleeve, including a central bore 27 extending therethrough. FIG. 4 shows the body 24 as soldered to the contact pin 18 and the shielding ground structure 22.

Referring again to FIG. 4, the body 24 includes a sleeve 26, preferably a ferrite sleeve, providing the inductance L heretofore mentioned, with such sleeve being plated throughout bore 27 through a plating 28 made to extend partially over the outside surface at portion 30 with a gap in the center of the sleeve between facing inner edges of inner end portions 31. The end platings 32 are subsequently extended as at 34 in a manner to be described. Extending along the length of sleeve 26 is a dielectric coating 36 intended to provide the capacitors C heretofore discussed. The dielectric material 36 is subsequently overplated at ends 34, and also at central band 38 to define a central electrode structure. Inner end portions 31 of the banding and plating 30 and end portions 39 of central band 38 coextending along and radially outwardly of end portions 31 form the other electrode structures providing capacitive regions R extending between the electrodes 30 and 38 in the region of overlap of such electrodes as spaced by dielectric material 36. Two distinct regions R of overlap are formed by the bands of electrode material plated continuously circumferentially and coaxially of the sleeve 26 and coating 36. As can be seen, these electrodes are interconnected by the solder beads S and S' to the signal and grounding structures respectively of the device.

With the invention filter in place as shown in FIG. 4, a signal passing through the contact 18 will experience the inductive effects of the inductance L through the ferrite sleeve and the capacitance C separated in the two bands as described. Thus, the filter 24 will function as a pi filter with respect to signals transmitted via contacts 18 with unwanted frequencies grounded through the ground structure 22.

In accordance with the method of the invention, a ferrite sleeve such as 26 is first banded along approximately the central one-fourth of the outer surface with a plating resist in a well known manner, and then the sleeve is plated, including the platings 28, 32 as well as the electrode plating 30, with the resist material subsequently removed as is conventional, to define a gap between the inner edges of the inner end portions 31 of first electrode regions 30 thus defined. This may be accomplished by a number of electroless and/or electroplating techniques. Typically, a copper plating is applied, followed by a nickel plating and either tin or tin lead alloy, or in some instances, a precious metal. The plating utilized must be capable of withstanding the heat necessary to sinter a subsequent coating of dielectric material 36, typically done in the range of 800° C. Such coating 36, may be done by the application of dielectric material such as barium titanate or strontium titanate achieved through electrophoretic deposition or other means to a suitable thickness with the dielectric subsequently sintered to provide an adequate structure. Thereafter, additional platings provides a conductive coating of 34 that links plating 32 and plating 28. Suitable bands of resist material are deposited on the outwardly facing surface near each end at 37 preventing plating in such regions, with the resist material subsequently removed after plating is completed to define a gap at 37, to leave the electrode 38 isolated electrically from the platings 28, 32, and 34. The platings that get soldered, including 32 and 38, must, of course, be sufficiently temperature resistant to withstand the soldering temperatures employed to define the solder beads S and S'.

As can be appreciated, the particular capacitive values, the capacitances C effected through the overlap of regions R may be varied by the choice of dielectric material for 36, the spacing or thickness of the coating 36 following firing, and the area defined by the electrodes 30 and 38. It is to be understood that the choice of ferrite material may also be varied to achieve an appropriate L with the particular L and C values interconnected in the fashion shown providing a particular pi filtering action. Ferrite sleeves 26 are typically on the order of 0.200 to 0.500 inches in length with an outer diameter of 0.090 inches, and an inner diameter of 0.043 inches. The dielectric coating was in one example made to have a thickness on the order of 0.003 to 0.004 inches following sintering, and the electrodes 30 and 38 were on the order of on overall thickness of 0.000150 inches, including a first plating of copper with a nickel overplate and a tin lead alloy plating over the outside of the dielectric material. The regions of overlap R are each about 0.050 inches (for the sleeve of 0.200 inches in length) and about 0.100 inches (for a sleeve of about 0.500 inches in length), and each region may be spaced from the end face of the filter about 0.020 inches and from the inner edge of the end electrode about 0.010 inches. A filter so made provided signal isolation on the order of 50 dB at 100 MHz.

Having now described the invention in terms of a filter structure and a method of manufacture, claims are appended intended to define what is inventive.

What is claimed is:

1. A method of manufacturing a filter having pi characteristics including the steps of:
   a. providing a sleeve of inductive material having a bore extending therethrough,
   b. applying resist material in a band on the outside of said sleeve and centered axially therealong and plating said sleeve with a first conductive coating through said bore and around the ends of the said sleeve, and removing the resist material, defining a signal electrode having spaced apart signal electrode regions along end portions of said sleeve,
   c. coating the outer surface of the sleeve and said signal electrode regions with a dielectric material and applying a resist material to the outside of said dielectric material, said resist material being applied in a pair of bands positioned spaced apart and at least extending toward both ends of the sleeve superposed over portions of said signal electrode regions other than at inner portions thereof, to define a gap therebetween of selected axial length to coextend over inner end portions of said signal electrode regions,
   d. plating the outside of the dielectric material in non-banded areas with a second conductive coating, and removing the resist, to form a ground electrode between the bands of resist material of a length to coextend over said inner end portions of both said signal electrode regions, with the first conductive coating on the sleeve forming a signal electrode that is exposed to be interconnected to a signal conductor, with the ground electrode exposed on the outwardly facing surface of the dielectric material to be connected to a grounding conductor and coextending over portions of said signal electrode defining regions of capacitance, thereby forming a one-piece filter structure having pi characteristics.

2. The method of claim 1, including the step of selecting properties of dielectric material and inductive material in conjunction with selecting dimensions of the dielectric material coating and the sleeve respectively, to provide an isolation on the order of greater than 50 dB at about 100 MHz.

* * * * *